United States Patent
Iida

(10) Patent No.: US 7,812,382 B2
(45) Date of Patent: Oct. 12, 2010

(54) IMAGE SENSING APPARATUS AND IMAGING SYSTEM

(75) Inventor: Satoko Iida, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 9 days.

(21) Appl. No.: 12/370,928

(22) Filed: Feb. 13, 2009

(65) Prior Publication Data

US 2009/0224346 A1 Sep. 10, 2009

(30) Foreign Application Priority Data

Mar. 6, 2008 (JP) .............................. 2008-056625

(51) Int. Cl.
*H01L 31/131* (2006.01)
*H01L 27/108* (2006.01)

(52) U.S. Cl. ............................ 257/292; 257/E31.125; 257/E27.13; 348/294

(58) Field of Classification Search ................ 257/239, 257/432, 291, 292, 675, E31.125, 431, 59, 257/72, E27.13; 348/294, 308, 311; 438/59, 438/57, 48

See application file for complete search history.

(56) References Cited

U.S. PATENT DOCUMENTS

| | | | | |
|---|---|---|---|---|
| 6,838,715 B1* | 1/2005 | Bencuya et al. | ............. | 257/291 |
| 2006/0061674 A1* | 3/2006 | Iida et al. | ................... | 348/308 |
| 2006/0249654 A1* | 11/2006 | Silsby et al. | ............. | 250/208.1 |
| 2007/0090274 A1* | 4/2007 | Lee et al. | ................. | 250/208.1 |
| 2009/0065832 A1* | 3/2009 | Masuoka et al. | ............ | 257/292 |

FOREIGN PATENT DOCUMENTS

| JP | 2003-078125 A | 3/2003 |
|---|---|---|
| JP | 2003-273342 A | 9/2003 |
| JP | 2007-189129 A | 7/2007 |

\* cited by examiner

*Primary Examiner*—Thomas L Dickey
*Assistant Examiner*—Nikolay Yushin
(74) *Attorney, Agent, or Firm*—Fitzpatrick, Cella, Harper & Scinto

(57) ABSTRACT

An image sensing apparatus includes an image sensing region where a plurality of pixels are two-dimensionally arrayed. Each pixel includes a photoelectric conversion unit, and a semiconductor region arranged below an element isolation region having an insulation film to isolate the photoelectric conversion unit from an adjacent pixel. The semiconductor region includes a plurality of diffusion layers. The offset amount of at least one diffusion layer in the semiconductor region with respect to the normal line is larger in a pixel arranged at the peripheral portion of the image sensing region than a pixel arranged at the center of the image sensing region.

9 Claims, 9 Drawing Sheets

IMAGE SENSING APPARATUS AND IMAGING SYSTEM

BACKGROUND OF THE INVENTION

1. Field of the Invention

The present invention relates to an image sensing apparatus and imaging system.

2. Description of the Related Art

These days, image sensing apparatuses such as a CCD image sensor and CMOS image sensor have widely been used in a video camera, digital still camera, and the like. The image sensing apparatus has an image sensing region where a plurality of pixels including photodiodes are two-dimensionally arrayed.

As shown in FIG. 8, in an image sensing apparatus disclosed in Japanese Patent Laid-Open No. 2003-273342, as the distance from the center of the image sensing region increases, optical axes PAc, PAb, and PAa of light entering photodiodes PD in pixels incline more greatly from normal lines PLc, PLb, and PLa of the light receiving surfaces. To efficiently converge light on each photodiode PD in this image sensing apparatus, an on-chip lens 547 is arranged above the photodiode PD. Signal lines 544, 543, and 542 shifted along the inclination of the optical axis of light are interposed between the on-chip lens 547 and the photodiode PD in accordance with the distance from the center of the image sensing region to the pixel (the distance increases in the order of c, b, and a in FIG. 8). According to Japanese Patent Laid-Open No. 2003-273342, even if the optical axis greatly inclines from the normal line of the light receiving surface, light can reach the photodiode PD without losing it, improving the light receiving sensitivity of the photodiode near the peripheral portion of the image sensing region.

As shown in FIG. 9, in an image sensing apparatus (CCD image sensor) disclosed in Japanese Patent Laid-Open No. 2003-078125, a pixel spaced apart by a predetermined distance from the center of the image sensing region has a structure.

According to the technique disclosed in Japanese Patent Laid-Open No. 2003-078125, as the distance from the center of the image sensing region to the pixel increases, an optical axis PA of light entering a light receiving portion (photodiode) 605 inclines more greatly from a normal line PL of the light receiving surface. To efficiently converge light on the light receiving portion 605 in this image sensing apparatus, an on-chip lens 650 is arranged at a position along the optical axis PA above the light receiving portion 605. In the light receiving portion 605, impurity regions 605a to 605c are arranged to be shifted along the inclination of the optical axis PA of light in accordance with the distance from the center of the image sensing region to the pixel. According to Japanese Patent Laid-Open No. 2003-078125, smear by obliquely incident light near the peripheral portion of the image sensing region can be suppressed.

In the image sensing apparatus disclosed in Japanese Patent Laid-Open No. 2003-273342, as the distance from the center of the image sensing region to the pixel increases, regions CA1 to CA3 where light entering the photodiode PD is photoelectrically converted to generate electric charges are formed closer to the photodiodes PD of adjacent pixels, as shown in FIG. 8. Electric charges obtained by photoelectric conversion by the photodiode PD of a specific pixel may leak into the photodiode PD of a pixel adjacent to the specific pixel. That is, electric charges may leak into an adjacent pixel owing to obliquely incident light.

In the image sensing apparatus disclosed in Japanese Patent Laid-Open No. 2003-078125, it is considered that pixels in the image sensing region have the same positional relationship between the light receiving portion 605 and a channel stopper 609. In this case, as the distance from the center of the image sensing region to the pixel increases, a region where light entering the light receiving portion 605 is photoelectrically converted to generate electric charges may be formed closer to the channel stopper 609.

For example, in a pixel symmetrical within the image sensing region about the center of the image sensing region to the pixel shown in FIG. 9, it is considered that the optical axis inclines from the normal line PL of the light receiving portion 605 in a direction toward the channel stopper 609 (directional symmetrical to the optical axis PA in FIG. 9). In this case, obliquely incident light is photoelectrically converted in a region near the channel stopper 609 at the light receiving portion 605. Generated electric charges may leak into an adjacent pixel over a potential barrier formed by the channel stopper 609. In other words, electric charges may leak into an adjacent pixel owing to obliquely incident light.

SUMMARY OF THE INVENTION

It is an aim of the present invention to suppress leakage of electric charges into an adjacent pixel that is caused by obliquely incident light.

According to the first aspect of the present invention, there is provided an image sensing apparatus comprising an image sensing region where a plurality of pixels are two-dimensionally arrayed, each pixel including a photoelectric conversion unit, an element isolation region having an insulation film to isolate the photoelectric conversion unit from an adjacent pixel, and a semiconductor region arranged below the element isolation region to isolate the photoelectric conversion unit from the adjacent pixel, the semiconductor region including a plurality of diffusion layers at different depth positions, wherein an offset amount of at least one diffusion layer in the semiconductor region with respect to a normal line passing through a center of a light receiving surface of the photoelectric conversion unit in the pixel is larger in a pixel arranged at a peripheral portion of the image sensing region than a pixel arranged at a center of the image sensing region.

According to the second aspect of the present invention, there is provided an imaging system comprising the image sensing apparatus, an optical system which forms an image on an image sensing surface of the image sensing apparatus, and a signal processing unit which processes a signal output from the image sensing apparatus to generate image data.

The present invention can suppress leakage of electric charges into an adjacent pixel that is caused by obliquely incident light.

Further features of the present invention will become apparent from the following description of exemplary embodiments with reference to the attached drawings.

DESCRIPTION OF THE EMBODIMENTS

Figure 1:
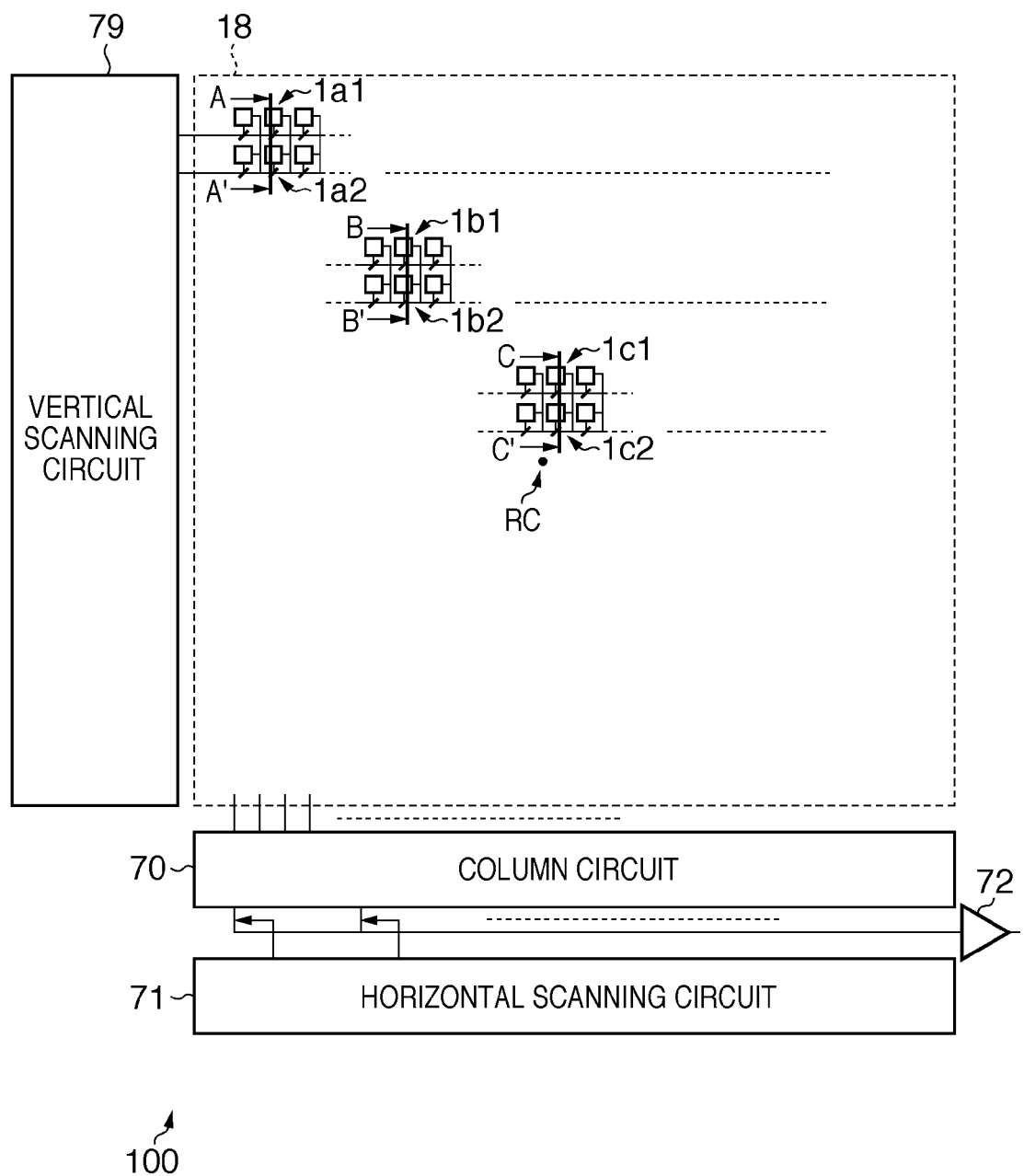
FIG. 1 is a diagram showing the schematic arrangement of an image sensing apparatus according to the first embodiment of the present invention.

The schematic arrangement of an image sensing apparatus 100 according to the first embodiment of the present invention will be explained with reference to FIG. 1. FIG. 1 is a diagram showing the schematic arrangement of the image sensing apparatus 100 according to the first embodiment.

The image sensing apparatus 100 includes an image sensing region 18, vertical scanning circuit 79, column circuit 70, horizontal scanning circuit 71, and output circuit 72.

In the image sensing region 18, a plurality of pixels are two-dimensionally arrayed. FIG. 1 exemplifies pixels 1c1 and 1c2 close to a center RC of the image sensing region 18, pixels 1b1 and 1b2 farther from the center RC than the pixels 1c1 and 1c2, and pixels 1a1 and 1a2 farther from the center RC than the pixels 1b1 and 1b2. In other words, the pixels 1b1, 1b2, 1a1, and 1a2 are arranged closer to the peripheral portion of the image sensing region than the pixels 1c1 and 1c2.

The vertical scanning circuit 79 vertically scans the image sensing region 18 to drive pixels in the image sensing region 18. When driven, the pixels output signals.

Upon receiving signals output from the pixels, the column circuit 70 holds them for only a predetermined period.

The horizontal scanning circuit 71 horizontally scans the column circuit 70 to sequentially transfer signals held by the column circuit 70 to the output circuit 72.

The output circuit 72 amplifies a transferred signal and outputs the amplified signal (image signal).

Figure 2:
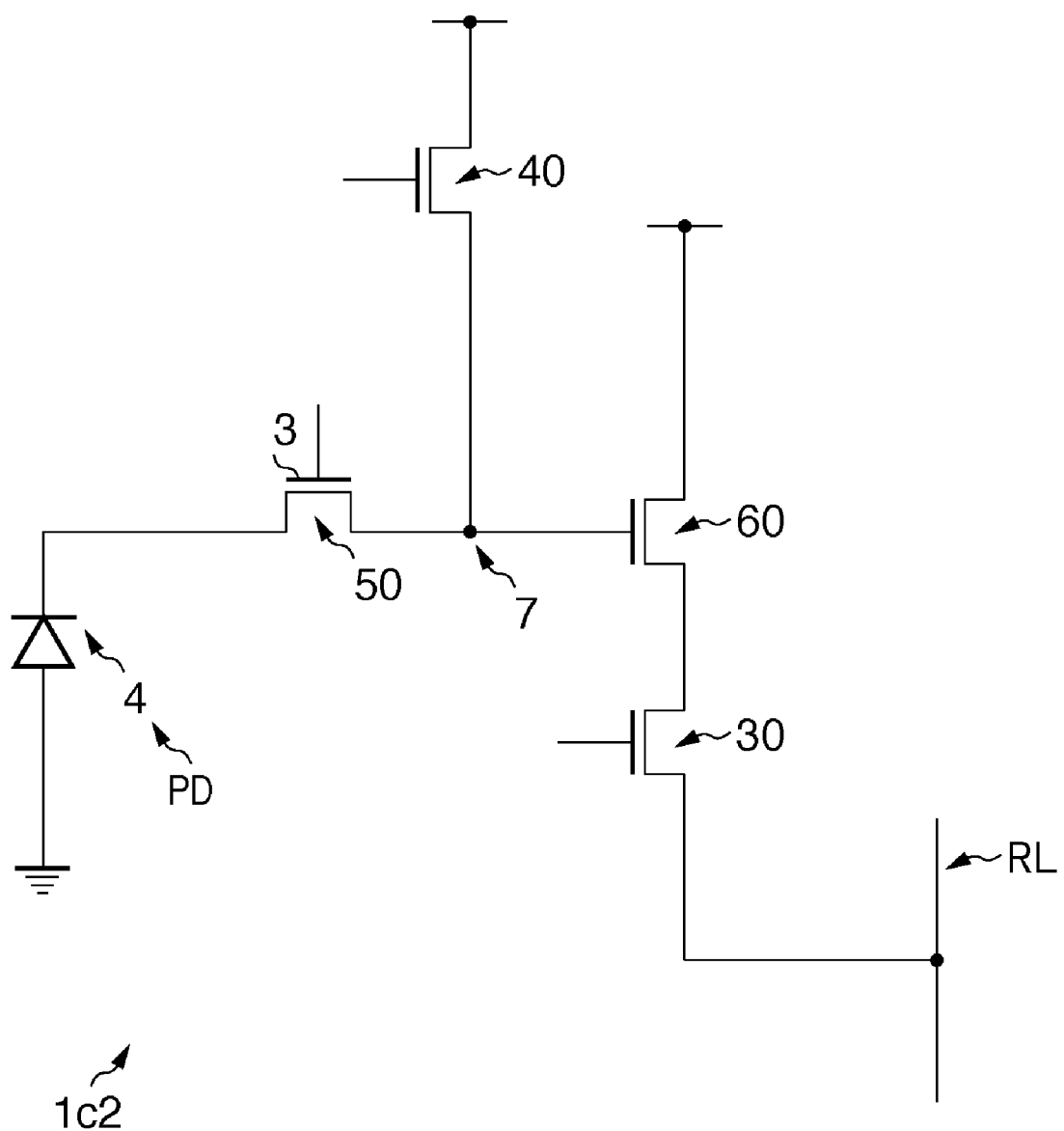
FIG. 2 is a circuit diagram showing the circuit arrangement of each pixel.

The arrangement of each pixel will be explained with reference to FIG. 2. FIG. 2 is a circuit diagram showing the circuit arrangement of each pixel. FIG. 2 exemplifies the circuit arrangement of the pixel 1c2, but this circuit arrangement also applies to the remaining pixels.

The pixel 1c2 includes a photoelectric conversion unit PD, transfer unit 50, charge-voltage converter 7, output unit 60, selection unit 30, and reset unit 40.

The photoelectric conversion unit PD photoelectrically converts received light to generate electric charges. The photoelectric conversion unit PD is, for example, a photodiode. The photoelectric conversion unit PD includes a charge accumulation region 4.

The transfer unit 50 transfers electric charges generated in the photoelectric conversion unit PD to the charge-voltage converter 7. The transfer unit 50 is, for example, a transfer MOS transistor. When the vertical scanning circuit 79 supplies an active-level signal to a gate electrode 3, the transfer unit 50 is turned on to transfer electric charges generated in the photoelectric conversion unit PD to the charge-voltage converter 7.

The charge-voltage converter 7 converts electric charges into a voltage. The charge-voltage converter 7 converts electric charges transferred from the photoelectric conversion unit PD into a voltage, and inputs the converted voltage to the output unit 60. The charge-voltage converter 7 is, for example, a floating diffusion.

The output unit 60 outputs, to a column signal line RL via the selection unit 30, a signal corresponding to a voltage input from the charge-voltage converter 7. The output unit 60 is, for example, an amplification MOS transistor which performs a source follower operation in conjunction with a constant current source (not shown) connected to the column signal line RL. The output unit 60 amplifies a signal corresponding to a voltage input to the gate electrode, and outputs the amplified signal to the column signal line RL via the source.

When the pixel is selected, the selection unit 30 transfers a signal output from the output unit 60 to the column signal line RL. The selection unit 30 is, for example, a selection MOS transistor. When the vertical scanning circuit 79 supplies an active-level signal to the gate electrode, the selection unit 30 is turned on to transfer a signal output from the output unit 60 to the column signal line RL. When the pixel is deselected, the selection unit 30 is turned off not to transfer a signal output from the output unit 60.

The reset unit 40 resets the charge-voltage converter 7. The reset unit 40 is, for example, a reset MOS transistor. When the vertical scanning circuit 79 supplies an active-level signal to the gate electrode, the reset unit 40 is turned on to reset the charge-voltage converter 7.

Figure 3:
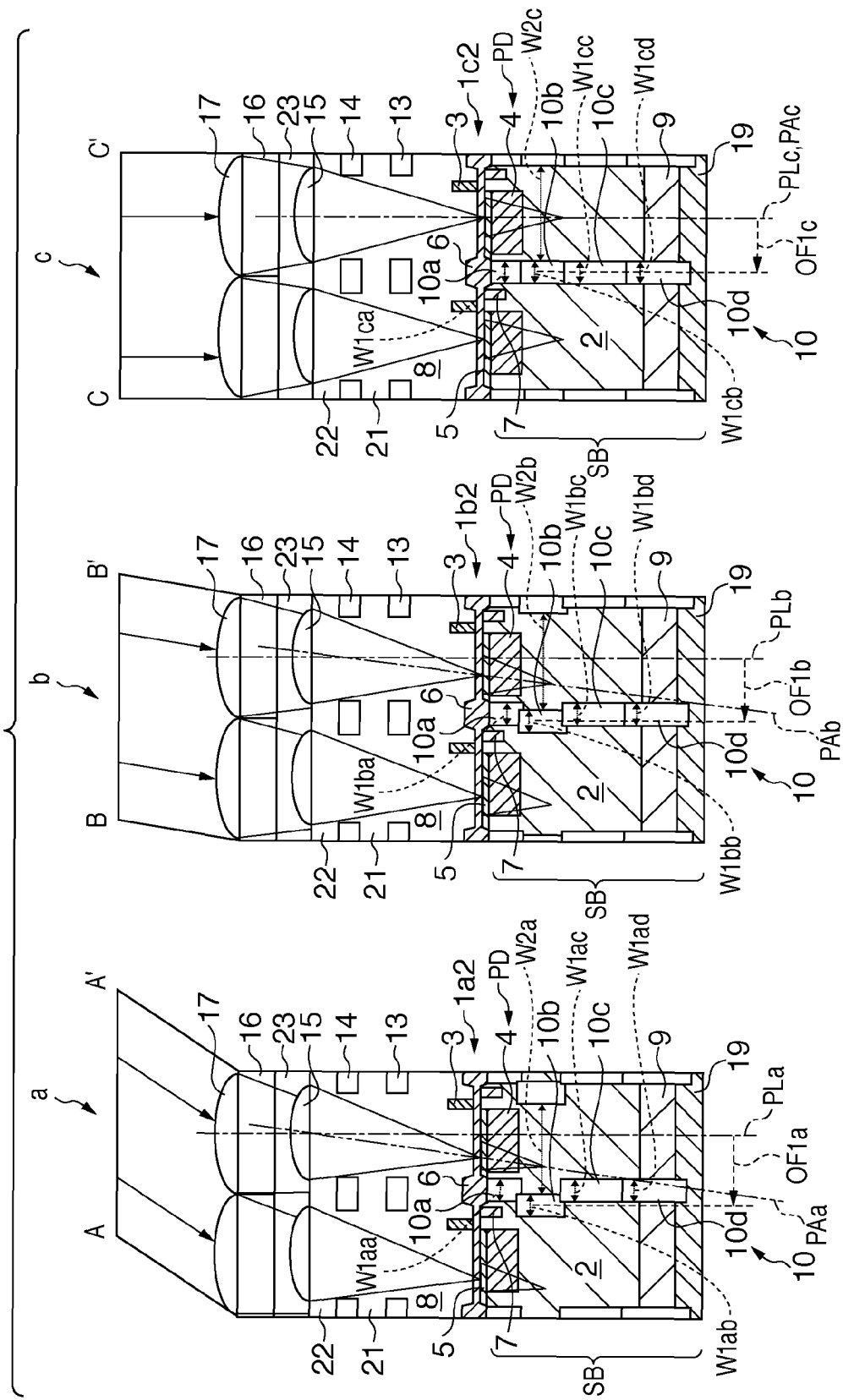
FIG. 3 is a sectional view showing the sectional structure of a pixel in the image sensing apparatus according to the first embodiment of the present invention.

The sectional structure of a pixel in the image sensing apparatus 100 according to the first embodiment of the present invention will be explained with reference to FIG. 3. a in FIG. 3 represents a sectional structure corresponding to a section taken along a line A-A' in FIG. 1. b in FIG. 3 represents a sectional structure corresponding to a section taken along a line B-B' in FIG. 1. c in FIG. 3 represents a sectional structure corresponding to a section taken along a line C-C' in FIG. 1.

A semiconductor region 19 contains an n-type impurity. A semiconductor region 2 contains an n-type impurity, and is an epitaxial layer formed by epitaxial growth. A semiconductor region 9 heavily contains a p-type impurity, and forms an overflow barrier against electric charges.

These regions are formed, for example, as follows. An n-type impurity-doped underlying substrate is prepared. A p-type impurity is doped near the surface of the underlying substrate to form a p-type semiconductor region 9 in the underlying substrate. A region of the underlying substrate where no p-type impurity is doped serves as a semiconductor region 19. Then, an epitaxial layer 2 is epitaxially grown on the underlying substrate, thereby forming a semiconductor substrate SB.

It should be noted that these regions may also be formed by another method. For example, a semiconductor substrate SB is prepared and undergoes ion implantation to form a semiconductor region 9 and another semiconductor region above it.

An electrode 3 is formed of polysilicon or the like, and serves as the gate electrode of the transfer unit 50 (transfer MOS transistor).

A a charge accumulation region 4 is an n-type impurity-doped semiconductor region formed in the semiconductor substrate SB, and accumulates electric charges generated by photoelectric conversion. A protection region 5 is a p-type impurity-doped semiconductor region formed in the surface portion of the semiconductor substrate SB, and protects the charge accumulation region 4. The epitaxial layer 2, charge accumulation region 4, and protection region 5 function as the photoelectric conversion unit PD (buried photodiode). The photoelectric conversion unit PD performs photoelectric conversion near the interface between the epitaxial layer 2 and the charge accumulation region 4, and generated electric charges are accumulated in the charge accumulation region 4. At this time, the protection region 5 reduces a dark current. The charge accumulation region 4 functions as the source of the transfer unit 50 (transfer MOS transistor).

The photoelectric conversion unit PD may take a structure other than a buried one.

An element isolation region 6 has an insulation film (element isolation film), and isolates an active region from another active region. The element isolation region 6 may take a LOCOS (LOCal Oxidation of Silicon) structure or an STI (Shallow Trench Isolation) structure. The charge-voltage converter 7 is a semiconductor region heavily containing an n-type impurity, and is a region (floating diffusion) where electric charges transferred from the photoelectric conversion unit PD are converted into a voltage. The charge-voltage converter 7 functions as the drain of the transfer unit 50 (transfer MOS transistor).

Wiring layers 13 and 14 are formed to have desired wiring patterns above the semiconductor substrate SB. The wiring layers 13 and 14 are formed of, for example, a metal. Interlayer insulation films 8, 21, and 22 insulate the gate electrode 3 and the wiring layers 13 and 14 from each other. An interlayer lens 15 is formed of a plasma silicon nitride film or the like on the uppermost interlayer insulation film 22. The interlayer lens 15 is arranged above the photoelectric conversion unit PD.

A planarization layer 23 is arranged on the interlayer lens 15 above the photoelectric conversion unit PD. A color filter layer 16 is formed on the planarization layer 23, and includes a color filter for selectively transmitting light of one of a plurality of wavelengths. The color filter included in the color filter layer 16 is, for example, a primary color filter for selectively transmitting light of the R, G, or B wavelength.

A microlens 17 is arranged on the color filter of the color filter layer 16 above the photoelectric conversion unit PD.

A semiconductor region 10 is arranged below the element isolation region 6 to isolate the photoelectric conversion unit PD from another region (the photoelectric conversion unit PD of another pixel). The semiconductor region 10 includes a plurality of diffusion layers $10a$ to $10d$. Each of the diffusion layers $10a$ to $10d$ heavily contains a p-type impurity, and forms a potential barrier against electric charges to be accumulated in the charge accumulation region 4. The diffusion layers $10a$ to $10d$ are arranged at different distances (depths) from the light receiving surface of the photoelectric conversion unit PD in a direction along a normal line passing through the center of the light receiving surface of the photoelectric conversion unit PD.

The image sensing apparatus 100 has a pseudo light source called an exit pupil determined by a stop 93 (see FIG. 4) of a lens 92 used. The exit pupil distance, which is a distance from the lens focus to the exit pupil, is finite. Thus, as light comes close from the center RC of an image sensing region 18 to the peripheral portion, optical axes PAc to PAa of light entering the photoelectric conversion units PD incline more greatly from normal lines PLc to PLa, increasing the incident angle.

A case where a semiconductor region for isolating a photoelectric conversion unit in a pixel from that in another pixel has a constant offset amount with respect to a normal line passing through the center of the light receiving surface of the photoelectric conversion unit regardless of the distance from the center of the image sensing region to the pixel will be examined. In this case, obliquely incident light is photoelectrically converted in a region in the photoelectric conversion unit PD that is arranged near the semiconductor region for isolating the photoelectric conversion unit PD. Generated electric charges may leak into an adjacent pixel over a potential barrier formed by the semiconductor region. That is, electric charges may leak into an adjacent pixel owing to obliquely incident light.

On the contrary, in the first embodiment, each pixel in the image sensing region 18 of the image sensing apparatus 100 has the following feature. More specifically, the offset amount of at least part of the semiconductor region 10 with respect to the normal line PLc, PLb, or PLa passing through the center of the light receiving surface of the photoelectric conversion unit PD in a pixel is set larger in a pixel arranged at the peripheral portion of the image sensing region than a pixel arranged at the center of the image sensing region 18. That is, an offset amounts OF1c to OF1a of the diffusion layers $10b$, each of which is a part of the semiconductor region 10, with respect to the normal lines PLc to PLa passing through the centers of the light receiving surfaces of the photoelectric conversion units PD in pixels is larger in a pixel arranged at the peripheral portion of the image sensing region than a pixel arranged at the center of the image sensing region 18.

For example, in the pixel $1c2$ close to the center RC (see FIG. 1) of the image sensing region 18, the offset amount of the diffusion layer $10b$ with respect to the normal line PLc is OF1c. In the pixel $1b2$ farther from the center RC (see FIG. 1) than the pixel $1c2$, the offset amount of the diffusion layer $10b$ with respect to the normal line PLb is OF1b (>OF1c). In the pixel $1a2$ farther from the center RC (see FIG. 1) than the pixel $1b2$, the offset amount of the diffusion layer $10b$ with respect to the normal line PLa is OF1a (>OF1b). The offset amounts in the pixels $1c2$, $1b2$, and $1a2$ have a relation:

$$\text{OF1c} < \text{OF1b} < \text{OF1a} \tag{1}$$

The diffusion layers $10a$ to $10d$ having different offset amounts with respect to the normal line can be obtained by, for example, performing ion implantation using different photomasks for the respective diffusion layers $10a$ to $10d$.

A case where the width (in a direction perpendicular to the normal line) of a semiconductor region for isolating a photoelectric conversion unit in a pixel from that in another pixel is smaller in a pixel arranged at the peripheral portion of the image sensing region than a pixel arranged at the center of the image sensing region will be examined. In this case, the width of the semiconductor region 2 below the photoelectric conversion unit PD is smaller in a pixel at the center than a pixel at the peripheral portion. For this reason, the electric charge focusing efficiency of a photoelectric conversion unit PD at the peripheral portion differs from that of a photoelectric conversion unit PD at the center. The sensitivity of a photoelectric conversion unit PD at the peripheral portion may greatly differ from that of a photoelectric conversion unit PD at the center. That is, the sensitivity may greatly fluctuate within a plurality of photoelectric conversion units PD in the image sensing region.

On the contrary, in the first embodiment, each pixel in the image sensing region 18 of the image sensing apparatus 100 has the following feature. More specifically, the width of the semiconductor region 10 in a direction perpendicular to the normal line PLc, PLb, or PLa passing through the center of the light receiving surface is equivalent between a pixel arranged at the center of the image sensing region 18 and that arranged at the peripheral portion of the image sensing region 18.

For example, in the pixel 1c2 close to the center RC (see FIG. 1) of the image sensing region 18, widths in the semiconductor region 10 in a direction perpendicular to the normal line PLc are W1ca to W1cd. In the pixel 1b2 farther from the center RC (see FIG. 1) than the pixel 1c2, widths in the semiconductor region 10 in a direction perpendicular to the normal line PLb are W1ba to W1bd (=W1ca to W1cd). In the pixel 1a2 farther from the center RC (see FIG. 1) than the pixel 1b2, widths in the semiconductor region 10 in a direction perpendicular to the normal line PLa are W1aa to W1ad (=W1ba to W1bd). The widths in the semiconductor regions 10 of the pixels 1c2, 1b2, and 1a2 have a relation:

$$W1ca=W1cb=W1cc=W1cd=W1ba=W1bb=W1bc=W1bd=W1aa=W1ab=W1ac=W1ad \quad (2)$$

As represented by equation (2), widths at different depths in the semiconductor region 10 are equivalent to each other. That is, the widths W1ca to W1cd of the diffusion layers 10a to 10d in the semiconductor region 10 in the pixel 1c2 are equivalent to each other. The widths W1ba to W1bd of the diffusion layers 10a to 10d in the semiconductor region 10 in the pixel 1b2 are equivalent to each other. The widths W1aa to W1ad of the diffusion layers 10a to 10d in the semiconductor region 10 in the pixel 1a2 are equivalent to each other. The diffusion layers 10a to 10d having different offset amounts with respect to the normal line can be obtained by changing the ion implantation angle and implantation energy using a single photomask for the respective diffusion layers 10a to 10d, instead of performing ion implantation using different photomasks for the respective diffusion layers 10a to 10d, as described above.

In this way, according to the first embodiment, the distance between a region where the photoelectric conversion unit PD performs photoelectric conversion in a pixel and a semiconductor region for forming a potential barrier can be made equivalent among the pixels of the image sensing region 18. Even if the distance from the center of the image sensing region to the pixel increases, electric charges generated by photoelectric conversion can be prevented from crossing a potential barrier formed in the semiconductor region. That is, leakage of electric charges into an adjacent pixel that is caused by obliquely incident light can be suppressed.

In addition, the widths W1ca to W1cd in the semiconductor region 10 in a pixel at the center are equivalent to the widths W1ba to W1bd and W1aa to W1ad in the semiconductor regions 10 in pixels at the peripheral portion. Hence, a width W2c of the semiconductor region 2 in the pixel at the center is equivalent to widths W2b and W2a of the semiconductor regions 2 in the pixels at the peripheral portion. Thus, the electric charge focusing efficiency of the photoelectric conversion unit PD in the pixel at the center can become equivalent to those of the photoelectric conversion units PD in the pixels at the peripheral portion. The sensitivity of the photoelectric conversion unit PD in the pixel at the center can become equivalent to those of the photoelectric conversion units PD in the pixels at the peripheral portion. As a result, fluctuations in sensitivity among a plurality of photoelectric conversion units PD in the image sensing region 18 can be reduced.

Accordingly, leakage of electric charges into an adjacent pixel that is caused by obliquely incident light can be suppressed. In addition, fluctuations in sensitivity within a plurality of photoelectric conversion units in the image sensing region can be reduced.

It is not indispensable to make equivalent between all pixels the distance between a region where the photoelectric conversion unit PD performs photoelectric conversion and a semiconductor region for forming a potential barrier. It is also possible to divide the image sensing region into a plurality of regions in accordance with the distance from the center of the image sensing region, and change the offset amount of the diffusion layer for each region. Depending on the size of the sensor chip, pixels in which diffusion layers have larger offset amounts than those in pixels arranged at the center may also be limited to only outermost pixels arranged at the peripheral portion in the image sensing region.

The first embodiment can also prevent obliquely incident light from reaching the photoelectric conversion unit of an adjacent pixel via a region where photoelectric conversion is done.

The first embodiment does not change the structure except for a semiconductor region for forming a potential barrier in a pixel. Also from this viewpoint, fluctuations in characteristics between the pixels of the image sensing region can be suppressed. The influence of the offset on other characteristics is small because the offset region is not a region for determining transfer characteristics, like a well formed at the peripheral portion of a charge transfer vertical CCD used in a CCD type image sensing apparatus. The photodiode (photoelectric conversion unit) can be determined in consideration of, for example, the channel of the transfer transistor (transfer unit) and the depletion region of the photodiode (photoelectric conversion unit), increasing the degree of freedom of the design.

A diffusion layer in the semiconductor region 10 for which the offset amount is changed in accordance with the distance from the center RC of the image sensing region 18 may also be the diffusion layer 10a, 10c, or 10d other than the diffusion layer 10b, or a combination of the diffusion layer 10b and the diffusion layer 10a, 10c, or 10d.

The number of diffusion layers included in the semiconductor region 10 is not limited to four shown in FIG. 3.

A portion (diffusion layer) of the semiconductor region 10 for which the offset amount is changed, and the offset amount may also be determined in accordance with the wavelength of light passing through the color filter.

Figure 5:
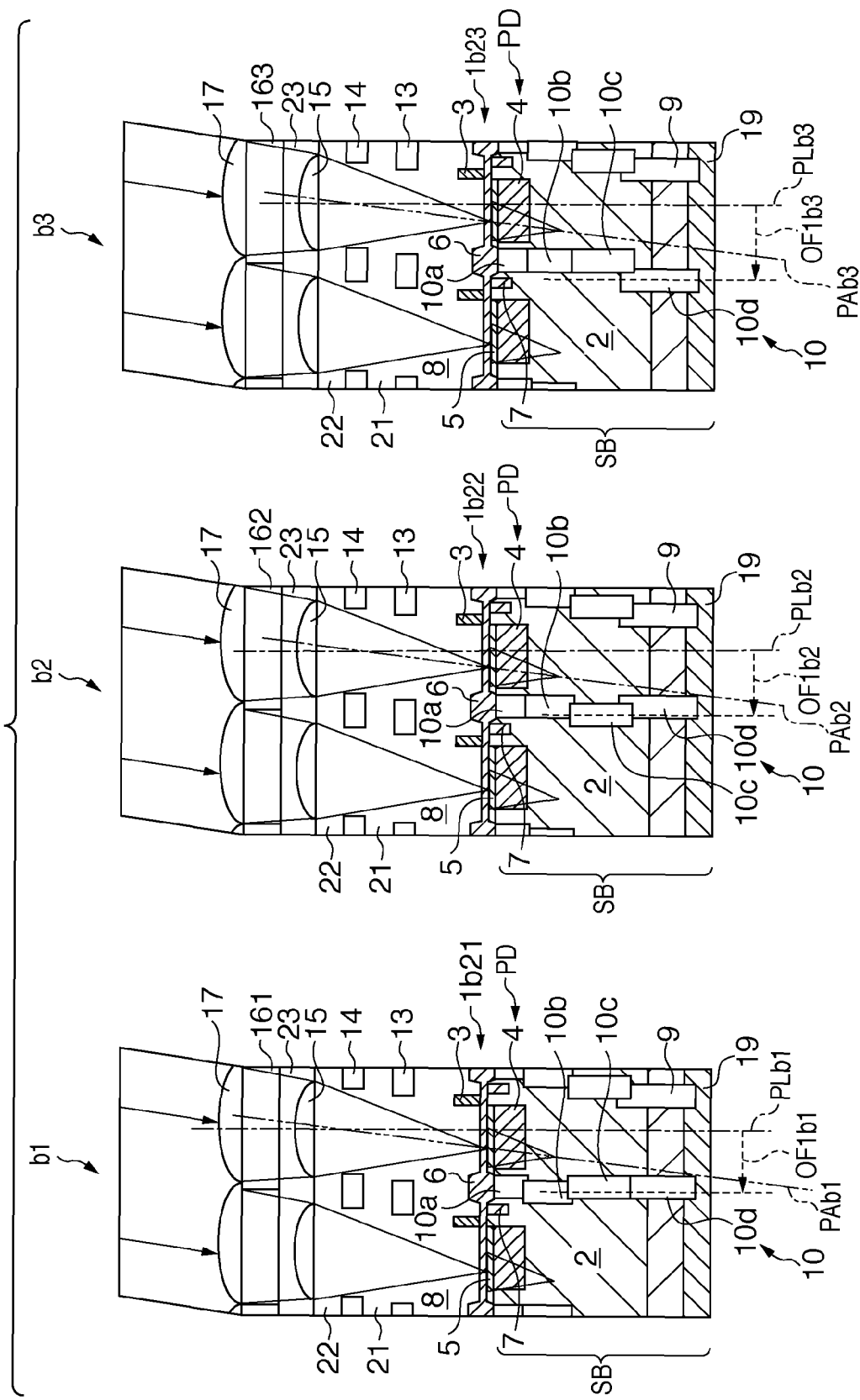
FIG. 5 is a sectional view showing the sectional structure of a pixel in the image sensing apparatus according to a modification to the first embodiment of the present invention.

For example, as shown FIG. 5, pixels 1b21 to 1b23 which correspond to different wavelengths of light passing through color filters though the distance from the center of the image sensing region 18 is equivalent to that of the pixel 1b2 will be examined. In the pixel 1b21, a color filter 161 transmits light of the blue wavelength. In the pixel 1b22, a color filter 162 transmits light of the green wavelength. In the pixel 1b23, a color filter 163 transmits light of the red wavelength. In this case, a region where photoelectric conversion is done in the pixel 1b21 is close to the surface of the semiconductor substrate SB. A region where photoelectric conversion is done in the pixel 1b23 is positioned deep from the surface of the semiconductor substrate SB. A region where photoelectric conversion is done in the pixel 1b22 is positioned between these regions. Even in this case, the offset amount of some diffusion layers in the semiconductor region 10 is determined to be larger for a longer distance from the center RC of the image sensing region 18 to the pixel. Some diffusion layers in the semiconductor region 10 are determined to be positioned deeper from the light receiving surface of the photoelectric conversion unit PD for a longer wavelength of light passing through the color filter. For example, when the distance from the center RC of the image sensing region 18 to the pixel remains unchanged, offset amounts OF1b1 to OF1b3 are determined to be larger for longer wavelengths of light passing through the color filters 161 to 163.

Thus, even when the wavelength of light entering the photoelectric conversion unit PD is different between pixels, the distance between a region where the photoelectric conversion unit PD performs photoelectric conversion in a pixel and a semiconductor region for forming a potential barrier can be made equivalent between the pixels of the image sensing region 18.

Figure 4:
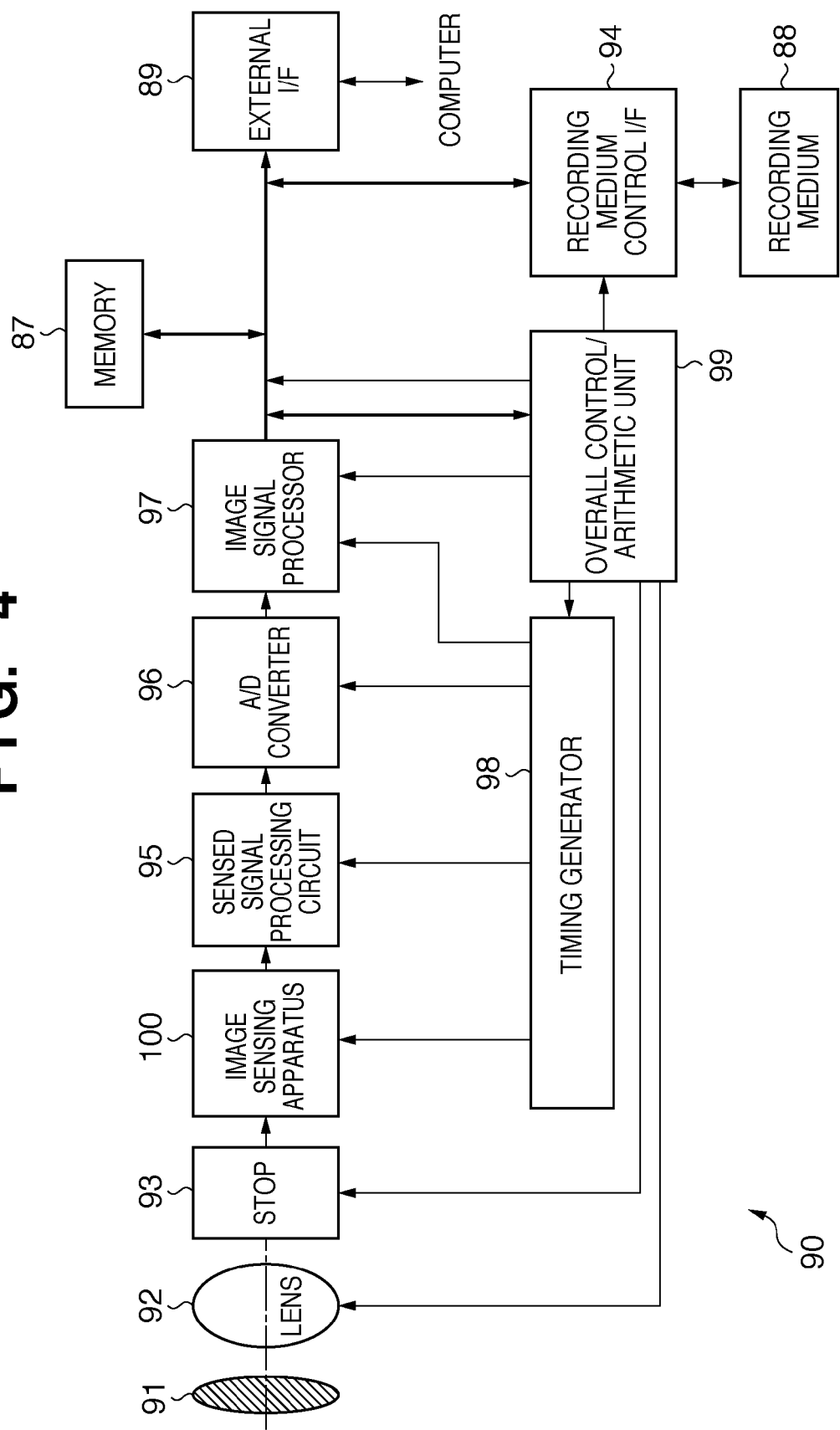
FIG. 4 is a block diagram showing an imaging system to which the image sensing apparatus according to the first embodiment is applied.

FIG. 4 shows an example of an imaging system to which the image sensing apparatus according to the present invention is applied.

As shown in FIG. 4, an imaging system 90 mainly includes an optical system, the image sensing apparatus 100, and a signal processing unit. The optical system mainly includes a shutter 91, the lens 92, and the stop 93. The signal processing unit mainly includes a sensed signal processing circuit 95, A/D converter 96, image signal processor 97, memory 87, external I/F 89, timing generator 98, overall control/arithmetic unit 99, recording medium 88, and recording medium control I/F 94. The signal processing unit may not include the recording medium 88.

The shutter 91 is arranged in front of the lens 92 on the optical path to control the exposure.

The lens 92 refracts incident light to form an object image in the image sensing region 18 (image sensing surface) of the image sensing apparatus 100.

The stop 93 is interposed between the lens 92 and the image sensing apparatus 100 on the optical path. The stop 93 adjusts the quantity of light guided to the image sensing apparatus 100 after passing through the lens 92.

The image sensing apparatus 100 converts an object image formed in the image sensing region 18 into an image signal. The image sensing apparatus 100 reads out the image signal from the image sensing region 18, and outputs it.

The sensed signal processing circuit 95 is connected to the image sensing apparatus 100, and processes an image signal output from the image sensing apparatus 100.

The A/D converter 96 is connected to the sensed signal processing circuit 95. The A/D converter 96 converts a processed image signal (analog signal) output from the sensed signal processing circuit 95 into an image signal (digital signal).

The image signal processor 97 is connected to the A/D converter 96. The image signal processor 97 performs various arithmetic processes such as correction for an image signal (digital signal) output from the A/D converter 96, generating image data. The image signal processor 97 supplies the image data to the memory 87, external I/F 89, overall control/arithmetic unit 99, recording medium control I/F 94, and the like.

The memory 87 is connected to the image signal processor 97, and stores image data output from the image signal processor 97.

The external I/F 89 is connected to the image signal processor 97. Image data output from the image signal processor 97 is transferred to an external device (e.g., a personal computer) via the external I/F 89.

The timing generator 98 is connected to the image sensing apparatus 100, sensed signal processing circuit 95, A/D converter 96, and image signal processor 97. The timing generator 98 supplies timing signals to the image sensing apparatus 100, sensed signal processing circuit 95, A/D converter 96, and image signal processor 97. The image sensing apparatus 100, sensed signal processing circuit 95, A/D converter 96, and image signal processor 97 operate in synchronism with the timing signals.

The overall control/arithmetic unit 99 is connected to the timing generator 98, image signal processor 97, and recording medium control I/F 94, and controls all of them.

The recording medium 88 is detachably connected to the recording medium control I/F 94. Image data output from the image signal processor 97 is recorded on the recording medium 88 via the recording medium control I/F 94.

With this arrangement, the image sensing apparatus 100 can provide a high-quality image (image data) as long as it can obtain a high-quality image signal.

Figure 6:
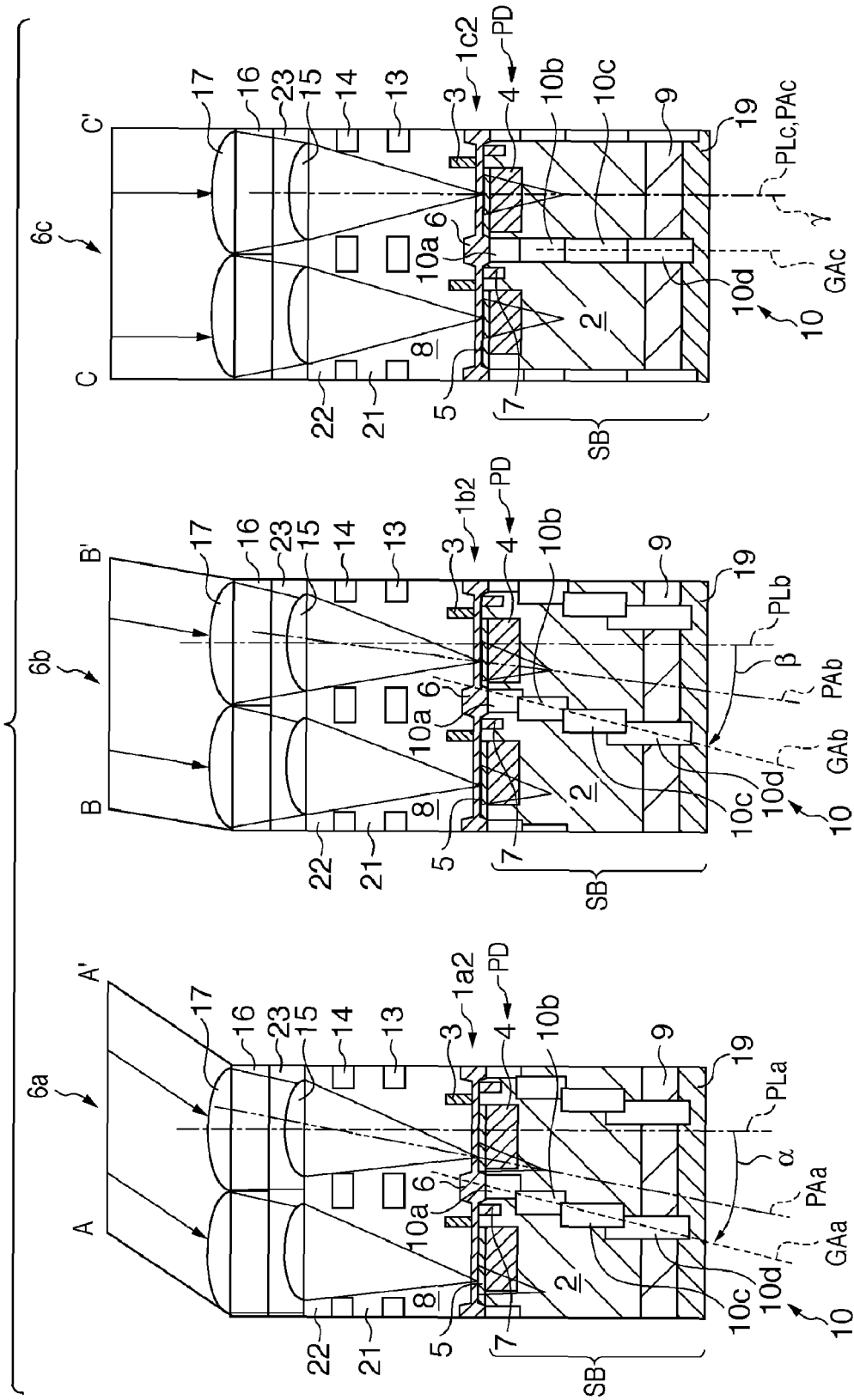
FIG. 6 is a sectional view showing the sectional structure of a pixel in an image sensing apparatus according to the second embodiment of the present invention.

An image sensing apparatus according to the second embodiment of the present invention will be explained with reference to FIG. 6. FIG. 6 is a sectional view showing the sectional structure of a pixel in the image sensing apparatus according to the second embodiment of the present invention. 6a in FIG. 6 represents a sectional structure corresponding to a section taken along the line A-A' in FIG. 1. 6b in FIG. 6 represents a sectional structure corresponding to a section taken along the line B-B' in FIG. 1. 6c in FIG. 6 represents a sectional structure corresponding to a section taken along the line C-C' in FIG. 1. A difference from the first embodiment will be mainly explained, and a description of the same part will not be repeated.

In the image sensing apparatus according to the second embodiment, each pixel in an image sensing region 18 has the following feature. Specifically, the inclination angles of central axes GAc, GAb, and GAa of semiconductor regions 10 with respect to normal lines PLc, PLb, and PLa passing through the centers of the light receiving surfaces of photoelectric conversion units PD in pixels are determined to be larger for a longer distance from a center RC of the image sensing region 18 to the pixel. That is, the central axes GAc, GAb, and GAa of the semiconductor regions 10 in pixels incline in a direction along optical axes PAc, PAb, and PAa of light entering the light receiving surfaces of the photoelectric conversion units PD.

For example, in a pixel 1c2 close to the center RC (see FIG. 1) of the image sensing region 18, the inclination angle of the central axis GAc with respect to the normal line PLc is $\gamma$ ($\approx 0$). In a pixel 1b2 farther from the center RC (see FIG. 1) than the pixel 1c2, the inclination angle of the central axis GAb with respect to the normal line PLb is $\beta$ ($>\gamma$). In a pixel 1a2 farther from the center RC (see FIG. 1) than the pixel 1b2, the inclination angle of the central axis GAa with respect to the normal line PLa is $\alpha$ ($>\beta$). The inclination angles in the pixels 1c2, 1b2, and 1a2 have a relation:

$$\gamma(\approx 0) < \beta < \alpha \quad (3)$$

A plurality of diffusion layers 10a to 10d having different offset amounts with respect to the normal line can be obtained by, for example, performing ion implantation using different photomasks for the respective diffusion layers 10a to 10d.

In this manner, according to the second embodiment, even if the depth of a region where the photoelectric conversion unit PD performs photoelectric conversion is different among pixels, the distance between the region where the photoelectric conversion unit PD performs photoelectric conversion in a pixel and the semiconductor region 10 can be made equivalent between the pixels of the image sensing region 18. That is, even if the wavelength of light entering the photoelectric conversion unit PD is different among pixels, the distance between the region where the photoelectric conversion unit PD performs photoelectric conversion in a pixel and the semiconductor region 10 can be made equivalent among the pixels of the image sensing region 18.

It is not indispensable to make equivalent among all pixels the distance between a region where the photoelectric conversion unit PD performs photoelectric conversion and a semiconductor region for forming a potential barrier. It is also possible to divide the image sensing region into a plurality of regions in accordance with the distance from the center of the image sensing region, and change the offset amount for each region. Depending on the size of the sensor chip, pixels in which diffusion layers have larger offset amounts than those in pixels arranged at the center may also be limited to only outermost pixels arranged at the peripheral portion in the image sensing region.

The pattern of each pixel can be formed in correspondence with all colors using a layout pattern at equivalent shrinkage ratio for adjacent pixels in the image sensing region 18.

Figure 7:
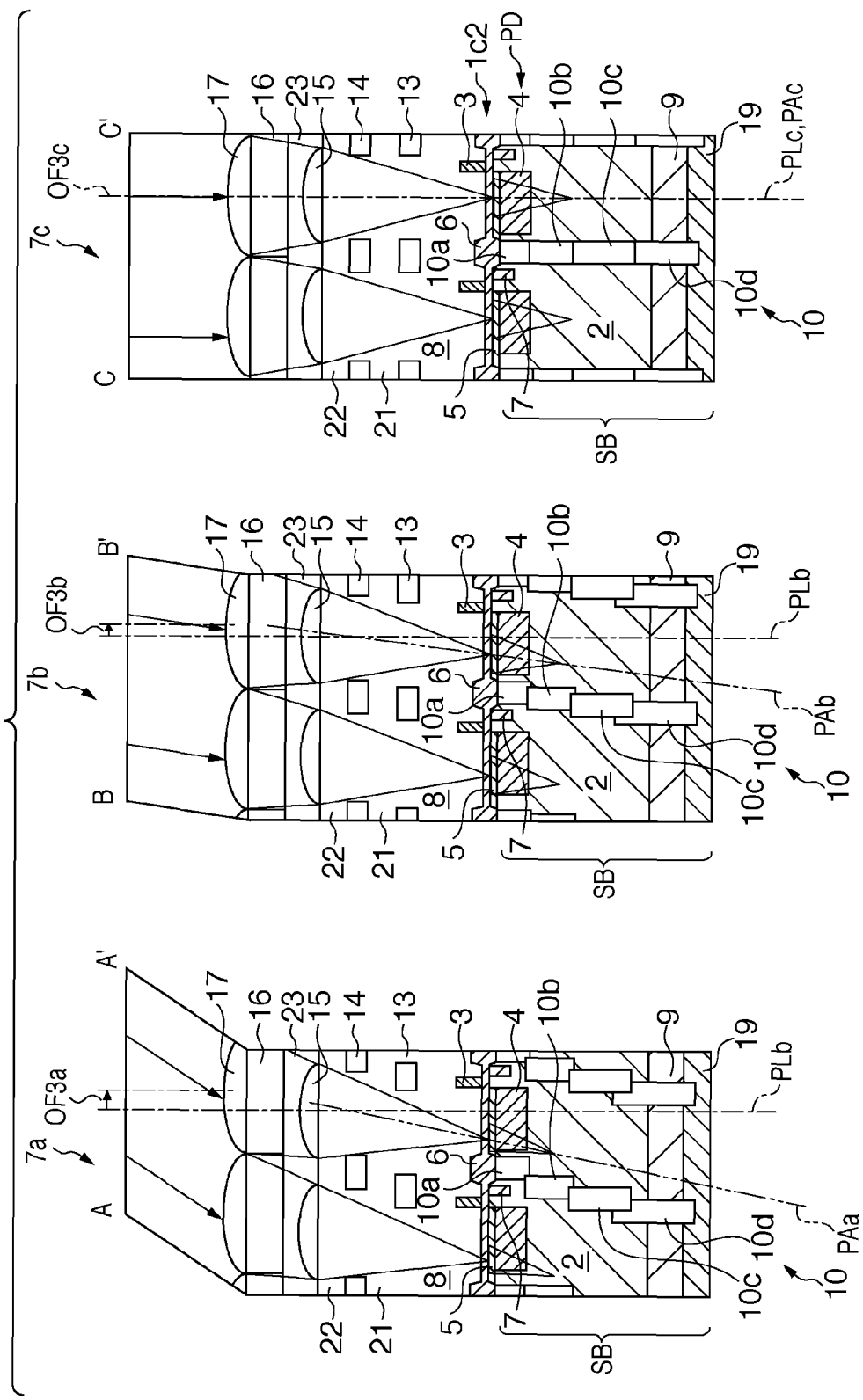
FIG. 7 is a sectional view showing the sectional structure of a pixel in an image sensing apparatus according to the third embodiment of the present invention.
Figure 8:
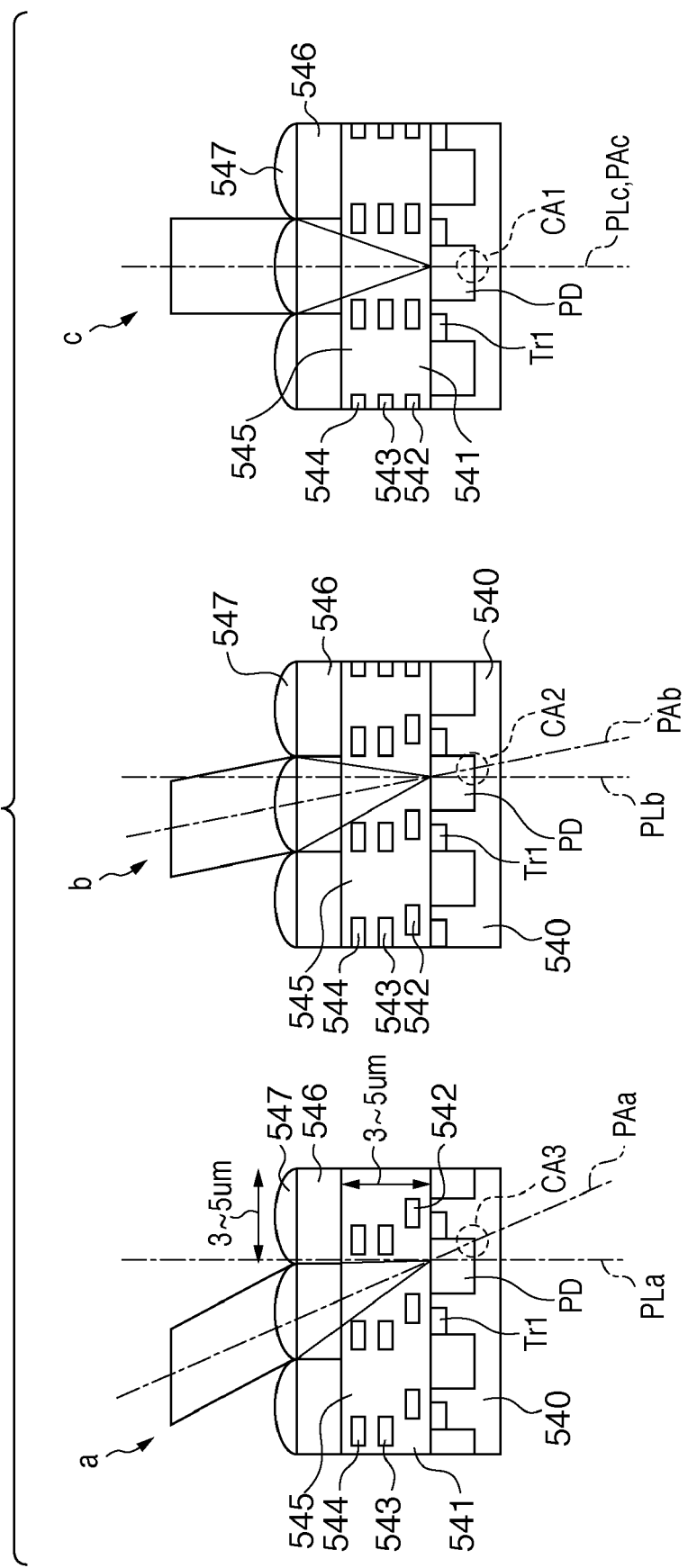
FIG. 8 is a sectional view for explaining a conventional technique.
Figure 9:
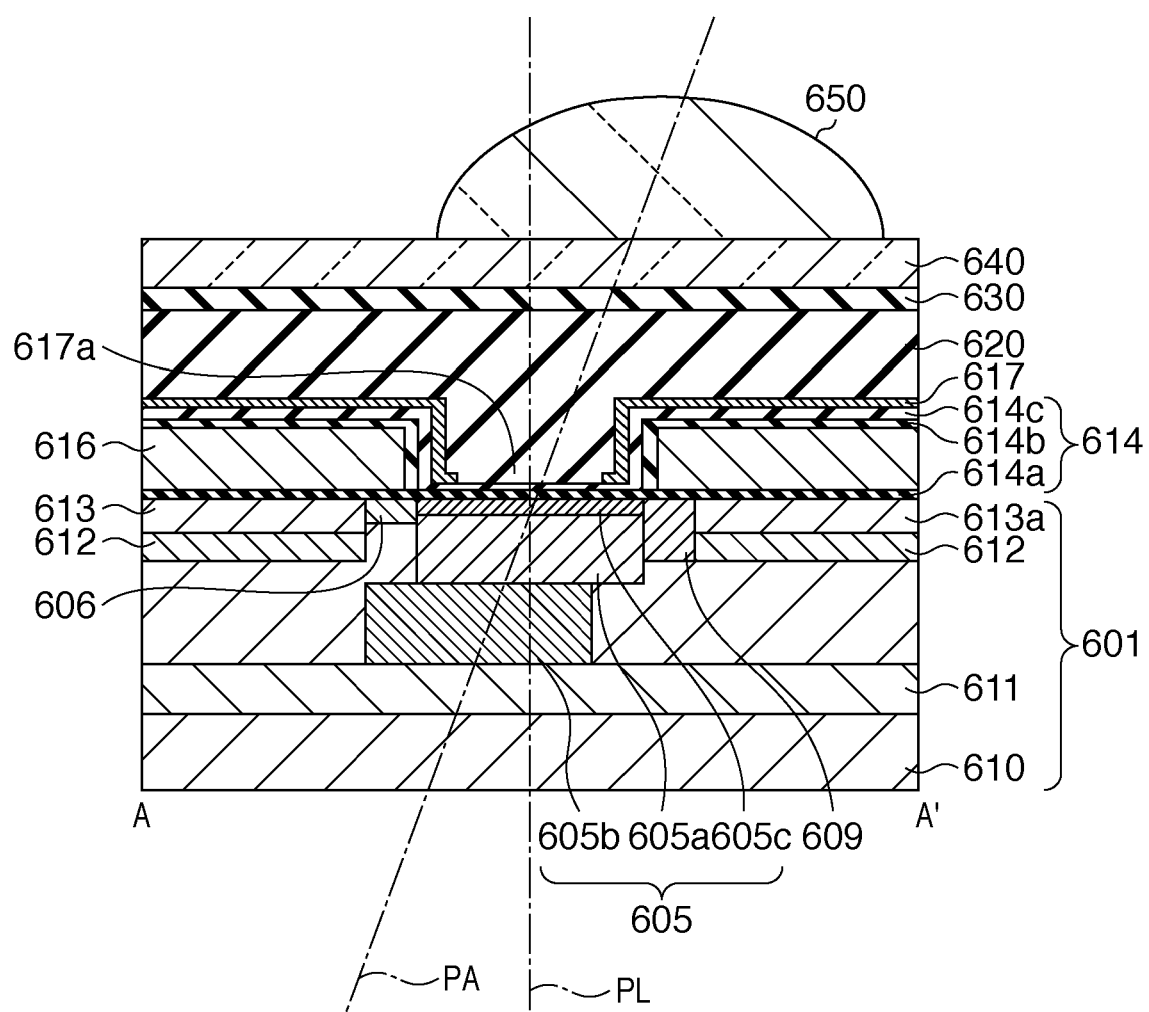
FIG. 9 is a sectional view for explaining a conventional technique.

An image sensing apparatus according to the third embodiment of the present invention will be explained with reference to FIG. 7. FIG. 7 is a sectional view showing the sectional structure of a pixel in the image sensing apparatus according to the third embodiment of the present invention. 7*a* in FIG. 7 represents a sectional structure corresponding to a section taken along the line A-A' in FIG. 1. 7*b* in FIG. 7 represents a sectional structure corresponding to a section taken along the line B-B' in FIG. 1. 7*c* in FIG. 7 represents a sectional structure corresponding to a section taken along the line C-C' in FIG. 1. A difference from the first embodiment will be mainly explained, and a description of the same part will not be repeated.

In the image sensing apparatus according to the third embodiment, each pixel in an image sensing region 18 has the following feature. Specifically, the offset amount of the center of gravity of an element with respect to a normal line PLc, PLb, or PLa passing through the center of the light receiving surface of a photoelectric conversion unit PD in a pixel is determined to be larger for a longer distance from a center RC of the image sensing region 18 to the pixel. The element includes at least one of a microlens 17, color filter 16, interlayer lens 15, and wiring layers 13 and 14.

For example, in a pixel 1*c*2 close to the center RC (see FIG. 1) of the image sensing region 18, the offset amount of the microlens 17 with respect to the normal line PLc is OF3$c$ ($\approx$0). In a pixel 1*b*2 farther from the center RC (see FIG. 1) than the pixel 1*c*2, the offset amount of the microlens 17 with respect to the normal line PLb is OF3$b$ (>OF3$c$). In a pixel 1*a*2 farther from the center RC (see FIG. 1) than the pixel 1*b*2, the offset amount of the microlens 17 with respect to the normal line PLa is OF3$a$ (>OF3$b$). The offset amounts in the pixels 1*c*2, 1*b*2, and 1*a*2 have a relation:

$$\text{OF3}c(\approx 0) < \text{OF3}b < \text{OF3}a \quad (4)$$

In this fashion, elements are shifted along the inclination of optical axes PAc to PAa. Even if the optical axes PAc to PAa greatly incline from the normal lines PLc to PLa of the light receiving surfaces, light can reach the photoelectric conversion unit PD without any loss.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-056625, filed Mar. 6, 2008, which is hereby incorporated by reference herein in its entirety.

What is claimed is:

1. An image sensing apparatus comprising an image sensing region where a plurality of pixels are two-dimensionally arrayed, each pixel including a photoelectric conversion unit, an element isolation region having an insulation film to isolate the photoelectric conversion unit from an adjacent pixel, and a semiconductor region arranged below the element isolation region to isolate the photoelectric conversion unit from the adjacent pixel, the semiconductor region including a plurality of diffusion layers at different depth positions, wherein an offset amount of at least one diffusion layer in the semiconductor region with respect to a normal line passing through a center of a light receiving surface of the photoelectric conversion unit in the pixel is larger in a pixel arranged at a peripheral portion of the image sensing region than a pixel arranged at a center of the image sensing region.

2. The apparatus according to claim 1, wherein a width of the at least one diffusion layer in the semiconductor region in a direction perpendicular to the normal line is equivalent between a pixel arranged at the center of the image sensing region and a pixel arranged at the peripheral portion of the image sensing region.

3. The apparatus according to claim 1, wherein an inclination angle of a line that roughly runs through centers of the plurality of diffusion layers of the semiconductor region with respect to the normal line is larger in a pixel arranged at the peripheral portion of the image sensing region than a pixel arranged at the center of the image sensing region.

4. The apparatus according to claim 1, wherein a line that roughly runs through centers of the plurality of diffusion layers of the semiconductor region in the pixel inclines in a direction along a direction of light entering the light receiving surface of the photoelectric conversion unit.

5. The apparatus according to claim 1, wherein
the pixel further includes a color filter, which selectively transmits light of one of a plurality of wavelengths so as to make the light of one of the plurality of wavelengths enter the photoelectric conversion unit,
the plurality of diffusion layers in the semiconductor region are arranged at depths different from each other from the light receiving surface of the photoelectric conversion unit,
an offset amount of the at least one diffusion layer in the semiconductor region is larger in a pixel arranged at the peripheral portion of the image sensing region than a pixel arranged at the center of the image sensing region, and
the at least one diffusion layer in the semiconductor region is determined to be positioned deeper from the light receiving surface of the photoelectric conversion unit for a longer wavelength of light passing through the color filter.

6. The apparatus according to claim 5, wherein, when a distance from the center of the image sensing region to the pixel remains unchanged, an offset amount of the at least one diffusion layer is determined to be larger for a longer wavelength of light passing through the color filter.

7. The apparatus according to claim 1, wherein
the pixel further includes an element arranged above the photoelectric conversion unit, and
an offset amount of a center of gravity of the element with respect to the normal line is determined to be larger in a pixel arranged at the peripheral portion of the image sensing region than a pixel arranged at the center of the image sensing region.

8. The apparatus according to claim 7, wherein the element includes at least one of a microlens, a color filter, an interlayer lens, and a wiring layer.

9. An image sensing apparatus according to claim 1, wherein the image sensing apparatus is incorporated in an imaging system that includes:

an optical system, which forms an image on an image sensing surface of the image sensing apparatus; and a signal processing unit, which processes a signal output from the image sensing apparatus to generate image data.

\* \* \* \* \*